United States Patent
Koizumi

(10) Patent No.: US 6,690,213 B2
(45) Date of Patent: Feb. 10, 2004

(54) CHOPPER TYPE COMPARATOR

(75) Inventor: Masanori Koizumi, Suwa (JP)

(73) Assignee: Seiko Epson Corporation (JP)

( * ) Notice: Subject to any disclaimer, the term of this patent is extended or adjusted under 35 U.S.C. 154(b) by 8 days.

(21) Appl. No.: 10/179,892

(22) Filed: Jun. 26, 2002

(65) Prior Publication Data

US 2003/0011410 A1 Jan. 16, 2003

(30) Foreign Application Priority Data

Jul. 6, 2001 (JP) ........................................ 2001-206673

(51) Int. Cl.[7] .............................................. H03K 17/00
(52) U.S. Cl. ......................... 327/124; 327/377; 327/77
(58) Field of Search ............................. 327/77, 91, 93, 327/94, 96, 124, 377; 330/9, 51

(56) References Cited

U.S. PATENT DOCUMENTS 5,262,686 A * 11/1993 Kurosawa .................... 327/77
5,973,517 A * 10/1999 Kao ............................. 327/77
6,225,847 B1 * 5/2001 Kim ........................... 327/257
6,518,808 B2 * 2/2003 Shimoda ..................... 327/172

FOREIGN PATENT DOCUMENTS

JP       08195655 A * 7/1996 ............ H03K/5/08

* cited by examiner

Primary Examiner—Terry D. Cunningham
Assistant Examiner—Quan Tra
(74) Attorney, Agent, or Firm—Harness, Dickey & Pierce, P.L.C.

(57) ABSTRACT

A chopper type comparator is equipped with an input switching circuit 1 that switches between an input voltage $V_{IN}$ and a reference voltage $V_{RE}$, a capacitor $C_1$, and an amplification circuit 11 that is formed from amplifiers (CMOS inverters) 12. The input switching circuit 1 is provided with a switch $CT_1$ that turns on and off the input voltage $V_{IN}$, and a switch $CT_2$ that turns on and off the reference voltage $V_{RE}$. Rising and falling of control signals to the P channel and N channel transistors of the switches $CT_1$ and $CT_2$ are simultaneously conducted, and an intersection of the rising and falling sections thereof coincide with a center of the amplitude of the drive signals.

5 Claims, 14 Drawing Sheets

PRIOR ART

PRIOR ART

CHOPPER TYPE COMPARATOR

BACKGROUND OF THE INVENTION

1. Technical Field of the Invention

The present invention relates to a chopper type comparator in a CMOS structure that is used for series type A/D converters, two-step parallel type AID converters and the like. More particularly, the present invention relates to a chopper type comparator that can reduce feed through noises of analogue switches.

2. Conventional Technology

In recent years, greater integration and greater speed in memories and microprocessor LSIs are actively pursued due to the advances made in the miniaturization technology in CMOS processes. If an analog circuit can be realized by a process compatible with that employed for these logical LSIs, digital circuits and analogue circuits can be disposed in the same chip, and higher reliability, such that reduction in size and lower cost can be realized. Therefore, realization of analogue circuits by CMOS processes is indispensable not only for A/D converters and D/A converters, but also for microprocessors on analog/digital chips, communications, and digital OA equipment.

As a comparator used in A/D converters, a chopper type DC amplifier using bipolar or FET transistors have been placed in practical use in a field where a high level of accuracy is required. In particular, MOS transistors are most suitable for chopper switches because their leak current is small and they do not generate offset voltage.

Currently, a variety of chopper type comparators with CMOS structure are studied.

FIG. 12 shows one example of a chopper type comparator with CMOS structure.

The chopper type comparator with CMOS structure shown in FIG. 12 was studied in "Analysis and Evaluation of CMOS Chopper Type Comparators" in Vol. J67-C, No. 5 (1984) of the Journal of the Institute of Electronics and Communication Engineers.

The chopper type comparator includes an input switching circuit 101 for switching between an input voltage $V_{IN}$ and a reference voltage $V_{RF}$, a capacitor $C_1$ that connects to the input switching circuit 101, an amplification circuit 111 formed from amplifiers (CMOS inverters) 112 in several stages, and a compensation circuit 121.

The input switching circuit 101 is provided with a switch $CT_1$ for turning on and off the input voltage $V_{IN}$, and a switch $CT_2$ for turning on and off the reference voltage $V_{RF}$. Each of the switches $CT_1$ and $CT_2$ is a semiconductor element such as a MOS field effect transistor. Gate terminals are shown in the figure at upper section and lower section of the respective switches $CT_1$ and $CT_2$. Control driver circuits 102 and 103 are connected to the gate terminals, respectively, in which control signals $CK_s$, and $CK_c$ are inputted, respectively. The switches $CT_1$ and $CT_2$ are controlled to turn on and off by the control signals $CK_s$ and $CK_c$, respectively.

The amplification circuit 111 comprises a CMOS inverter 112. A switch $CT_3$ that is formed from a semiconductor element such as a MOS field effect transistor is disposed in a manner to couple an input side and an output side of the CMOS inverter 112. The CMOS inverter 112 connects to a control driver circuit 113, which provides an input of a control signal $CK_b$. The switch $CT_3$ is controlled to turn on and off by the control signal $CK_b$.

It is noted that the compensation circuit 121 is provided to lower an offset voltage that may be caused by the field through between the gate and the drain of the switch $CT_3$. If the switch $CT_3$ is composed of a CMOS switch, self-compensation of charges by the PMOS and NMOS can be expected, and therefore the compensation circuit 121 is not necessary.

Next, a method for comparison and judgment by the chopper type comparator will be described.

FIG. 13 shows a chart to describe a method for comparison and judgment by the chopper type comparator.

Referring to FIG. 13, first, the switches $CT_1$ and $CT_3$ are turned on (Step 101). Then, a voltage on an input side of the capacitor $C_1$ becomes an input voltage $V_{IN}$, and a voltage on an output side thereof becomes a voltage $V_B$, such that the capacitor $C_1$ is charged with their difference voltage $(V_{IN}-V_B)$. Here, the voltage $V_B$ is a logical threshold voltage of the CMOS inverter 112, and its period is called a sampling period $(T_S)$.

Next, the switch $CT_3$ is turned off (Step 102), and the switch $CT_1$ is turned off (Step 103) in succession.

In this instance, the switch $CT_2$ is turned on (Step 104), and the input voltage $V_{IN}$ and the reference voltage $V_{RF}$ are compared, whose period is called a comparison period $(T_C)$.

FIG. 14 shows a timing chart indicating the above described comparison and judgment.

FIG. 14 shows a timing chart of a control signal CLK that controls the comparator shown in FIG. 12, and the control signals $CK_s$, $CK_b$, $CK_c$ that are inputted in the respective switches. Referring to FIG. 14, when the control signal CLK becomes LOW ($T_{PWL}$), the switch $CT_2$ is turned off 6 ns thereafter, and switches $CT_1$ and $CT_3$ are turned on 48 ns thereafter. As the switch $CT_1$ is turned on, a sampling is conducted for a period $T_S$.

When the control signal CLK becomes HIGH ($T_{HIGH}$), the switch $CT_3$ is turned off 18 ns thereafter, and the switch $CT_1$ is turned off 36 ns thereafter. As the switch $CT_1$ is turned off, the sampling ends.

34 ns after the end of the sampling, the switch $CT_2$ is turned on, and a comparison is conducted for the period $T_C$.

In the chopper type comparator described above, charge noise Q is generated when the switch $CT_1$ is turned off. The charge noise Q is called a field through noise. When the charge noised Q is generated, a voltage change of $dV_1=dQ_1/C_1$ occurs, such that the CMOS inverter 112 responds thereto, and starts providing an output.

Also, as shown in FIG. 12, two inverters are used in each of the control driver circuits 102 and 103. A control signal is inputted in one of the gate terminals of each of the switches $CT_1$ and $CT_2$ through one inverter, and a control signal is inputted in the other of the gate terminals of each of the switches $CT_1$ and $CT_2$ through two inverters. As a result, a delay for one inverter stage is generated between the control signals that drive the Pch and Nch transistors in the switches $CT_1$ and $CT_2$, such that the Pch and Nch transistors cannot be simultaneously turned on and off, and the above-described field through noise is increased.

Also, when the capacity of the capacitor $C_1$ is increased to suppress the value $dV_1$ to a smaller value, a response to the value dV1 may not be completely returned within the comparison period, even when the switches $CT_1$ and $CT_2$ are switched at a high speed to operate the comparator at high speed. In order to return this lengthy response of the CMOS inverter and amplify the $(V_{IN}-V_B)$ voltage, the response speed of the CMOS inverter must be increased, which leads to an increase in its power consumption. Furthermore, the use of a chopper type comparator with a larger capacitor C1 in an A/D converter causes to lower the input band of the A/D converter, which causes to impede its high-speed operation.

The present invention has been made in view of the problems discussed above, and its object is to provide a chopper type comparator with an improved driver structure for controlling switches, which can reduce field through noise of analogue switches and which is highly effective.

SUMMARY OF THE INVENTION

To solve the problems described above, a chopper type comparator in accordance with the present invention comprises: a first switch device composed of a PMOS transistor and an NMOS transistor for switching voltage to be compared; a second switch device composed of a PMOS transistor and an NMOS transistor for switching reference voltage; a capacitor connected to an output side of both of the switch devices for storing a charge according to the voltage; an amplification inverter that is connected to an output side of the capacitor and amplifies a capacitor output signal of the capacitor; a first control driver circuit that outputs a clock signal for controlling both of the switch devices; and a second control driver circuit that outputs a clock signal for controlling both of the amplification inverter, and the chopper type comparator is characterized in that the first control driver circuit is provided with two output devices, one of the output sides of the first control driver circuit connects to a gate terminal of the PMOS transistor of the first switch device and a gate terminal of the NMOS transistor of the second switch device, or to a gate terminal of the NMOS transistor of the first switch device and a gate terminal of the PMOS transistor of the second switch device, and another of the output sides of the first control driver circuit connects to a gate terminal of the NMOS transistor of the first switch device and a gate terminal of the PMOS transistor of the second switch device, or to a gate terminal of the PMOS transistor of the first switch device and a gate terminal of the NMOS transistor of the second switch device, wherein an intersection of rising and falling of drive output control signals of the first control driver circuit and/or the second control driver circuit defines a center of an amplitude of a drive signal.

With the chopper type comparator of the example described above, the switch $CT_1$ and the switch $CT_2$ can be substantially simultaneously switched, such that the field through can be cancelled by the offset effect of NMOS and PMOS channel forming carriers, and the voltage change $dV_1$ itself can be reduced.

Also, since the capacity of the capacitor $C_1$ does not need to be increased to suppress the voltage change $dV_1$ that may be caused by charge noises, a higher operation speed is attained, and a smaller chip area is achieved.

Also, a lengthy response of the inverter due to the voltage change $dV_1$ is not outputted, and a comparison can be reliably conducted within a comparison period.

In the chopper type comparator described above, in the first control driver circuit and/or the second control driver circuit, a drive input control signal that is inputted in the driver circuits is branched to two output circuits, wherein one of the output circuits is provided with a plurality of first control inverters, and another of the output circuits is provided with a plurality of second control inverters in half the number of the first control inverters, wherein an L-size (transistor length) of transistors that form the second control inverter may preferably be two times an L-size of transistors that form the first control inverter.

When the number of inverters disposed is different, the L-size of the transistors may be changed, and the switches can be switched substantially simultaneously without a delay. By this, the field through at the time of switching can be cancelled, and a voltage change due to charge noises can be controlled, such that an elongation of the amplifier response can be suppressed.

In the chopper type comparator described above, in the first control driver circuit and/or the second control driver circuit, a drive input control signal that is inputted in the driver circuits is branched to two output circuits, wherein one of the output circuits connects to a first D flip-flop and an EXOR circuit through a plurality of control inverters, and another of the output circuits connects to a second D flip-flop and an EXOR circuit, wherein output sides of the EXOR circuits connect to both of the flip-flops, and both of the flip-flops output signals to be inputted to the flip-flops upon receiving control signals from the EXOR circuits.

By the control driver circuit described above, control signals at different levels are outputted in synchronism with one another, such that the switches can be switched substantially simultaneously without a delay. By this, the field through at the time of switching can be cancelled, and a voltage change due to charge noises can be controlled, such that an elongation of the amplifier response can be suppressed.

In the chopper type comparator described above, in the first control driver circuit and/or the second control driver circuit, a drive input control signal that is inputted in the driver circuits is branched to two output circuits, wherein one of the output circuits is provided with a first control inverter including a plurality of NAND circuits, and another of the output circuits is provided with a second control inverter including NAND circuits in half the number of the NAND circuits of the first control inverter, wherein a substantial L-size (transistor length) of the second control inverter may preferably be two times an L-size of the first control inverter.

When the number of inverters disposed is different, the substantial L-size of the transistors may be changed, and the switches can be switched substantially simultaneously without a delay. By this, the field through at the time of switching can be cancelled, and a voltage change due to charge noises can be controlled, such that a prolongation of the amplifier response can be suppressed.

In the chopper type comparator described above, two P-channel transistors disposed in parallel and two N-channel transistors disposed in series may preferably be disposed in the first control inverter, and four P-channel transistors disposed in parallel, and four N-channel transistors disposed in series may preferably be disposed in the second control inverter.

In the control driver circuit in this example, even when basic cells, which are often used in gate array ASICs, as the transistors, channel conductance $\beta_N$ and $\beta_P$ can be made generally equal to one another, and the switches can be switched substantially simultaneously without a delay. By this, the field through at the time of switching can be cancelled, and a voltage change due to charge noises can be controlled, such that an elongation of the amplifier response can be suppressed.

In the chopper type comparator described above, two P-channel transistors disposed in parallel and two N-channel transistors disposed in series are disposed in the first control inverter, and four P-channel transistors disposed in series, and four N-channel transistors disposed in series are disposed in the second control inverter.

In the control driver described above also, the switches can be switched substantially simultaneously without a delay. By this, the field through at the time of switching can be cancelled, and a voltage change due to charge noises can be controlled, such that an elongation of the amplifier response can be suppressed.

DETAILED DESCRIPTION OF THE PREFERRED EMBODIMENTS OF THE PRESENT INVENTION

Embodiments will be described below with reference to the accompanying drawings.

First, a chopper type comparator in accordance with a first embodiment of the present invention will be described.

Figure 1:
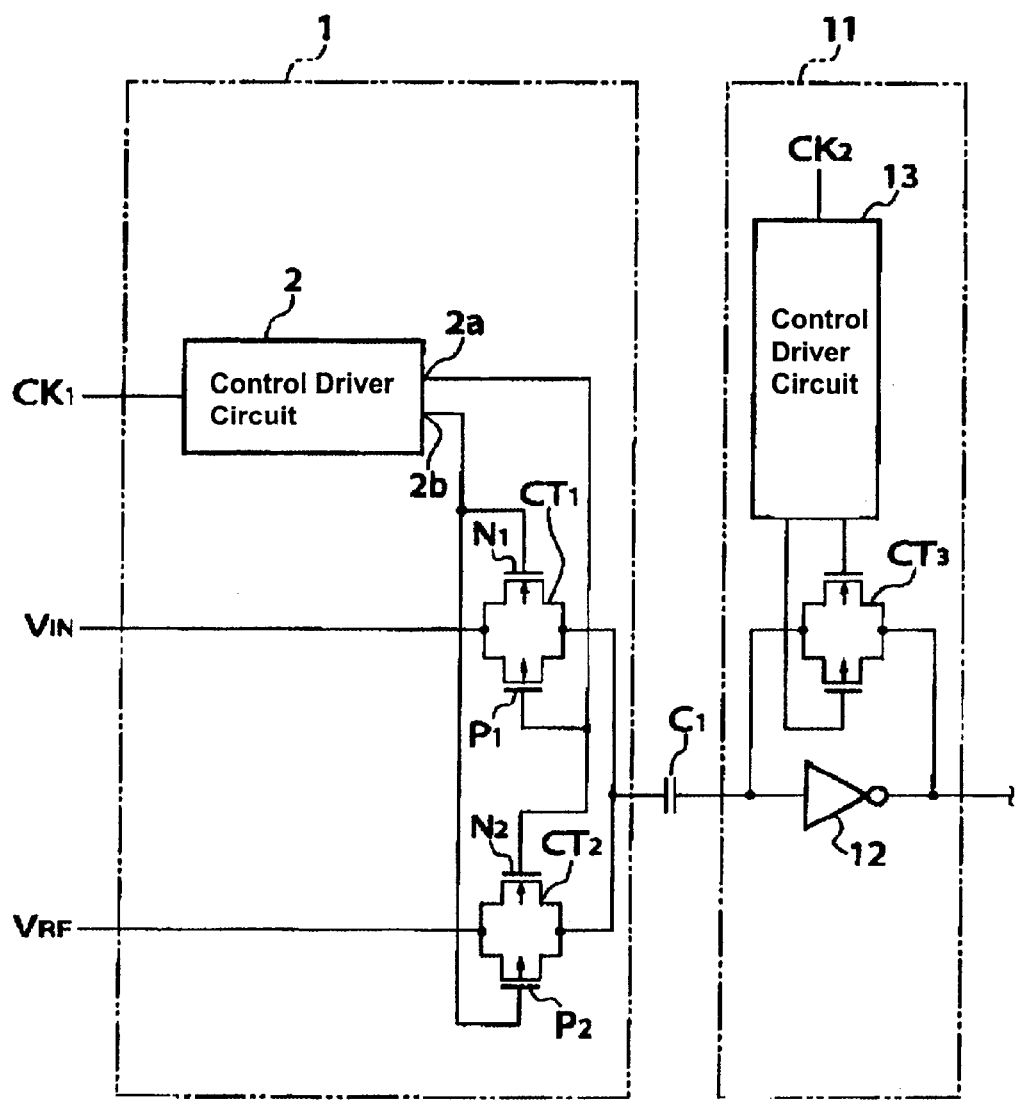
FIG. 1 schematically shows a structure of a chopper type comparator in accordance with a first embodiment of the present invention.

FIG. 1 schematically shows a structure of the chopper type comparator in accordance with the first embodiment of the present invention.

Figure 10:
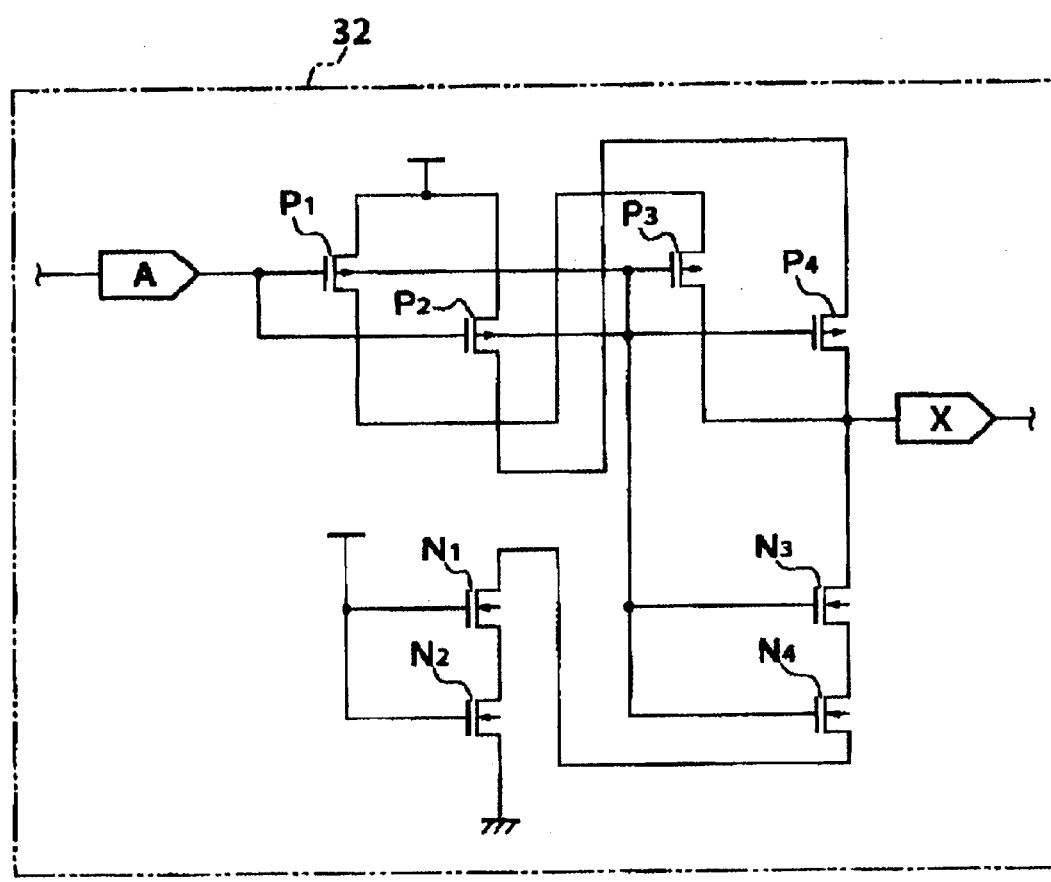
FIG. 10 shows a structure of the inverter 32.

FIG. 1 shows an input switching circuit 1 that switches between an input voltage $V_{IN}$ and a reference voltage $V_{RE}$, a capacitor $C_1$ that is connected to the input switching circuit 1, and an amplification circuit 11 that is formed from amplifiers (CMOS inverters) 12 in several stages (only one of them is shown in the figure), like those shown in FIG. 10.

The input switching circuit 1 is provided with a switch $CT_1$ that turns on and off the input voltage $V_{IN}$, and a switch $CT_2$ that turns on and off the reference voltage $V_{RE}$. Each of the switches $CT_1$ and $CT_2$ is a semiconductor element such as a MOS field effect transistor. Gate terminals $N_1$ and $P_1$, and $N_2$ and $P_2$ are shown in the figure at upper section and lower section of the respective switches $CT_1$ and $CT_2$, respectively. A control driver circuit 2 is connected to the gate terminals. The control driver circuit 2 receives an input of a control signal $CK_1$, outputs an open/close instruction to the gate terminals $P_1$ and $N_2$ from one of its output sections 2a, and outputs an open/close instruction to the gate terminals $N_1$ and $P_2$ from the other of its output sections 2b.

The amplification circuit 11 comprises a CMOS inverter 12. A switch $CT_3$ that is formed from semiconductor elements such as MOS field effect transistors is disposed in a manner to couple an input side and an output side of the CMOS inverter 12. The CMOS inverter 12 connects to a control driver circuit 13 that has a structure similar to that of the control driver circuit 2. A control signal $CK_2$ is inputted in the control driver circuit 13, whereby the switch $CT_3$ is controlled to turn on and off.

Here, in the chopper type comparator in this example, an intersection at rising and falling of output control signals of the control driver circuit 2 and/or the control driver circuit 13 may preferably coincide with a center of an amplitude of drive signals.

Figure 2:
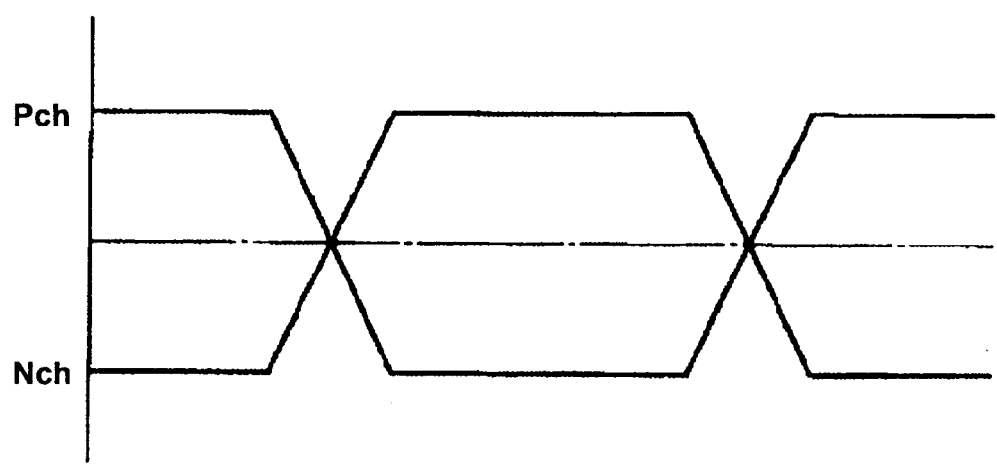
FIG. 2 is a chart showing states of rising and falling of output control signals.

FIG. 2 shows states of rising and falling of output control signals.

FIG. 2 shows the control signals that rise and fall, which are provided to the P channel and N channel transistors of the switches $CT_1$, $CT_2$ and $CT_3$. A dot-and-dash line in the figure indicates a center of the amplitude of the control signals. As shown in FIG. 2, in the chopper type comparator of this example, rising and falling of the control signals to the P channel and N channel transistors are simultaneously conducted, and an intersection of the rising and falling sections thereof coincide with a center of the amplitude of the drive signals. By using such drive signals, carriers that form channels of the P channel and N channel transistors are offset, such that a voltage change $dV_1$ due to charge noises can be cancelled.

Next, a method for comparison and judgment by the chopper type comparator described above will be described.

Figure 3:
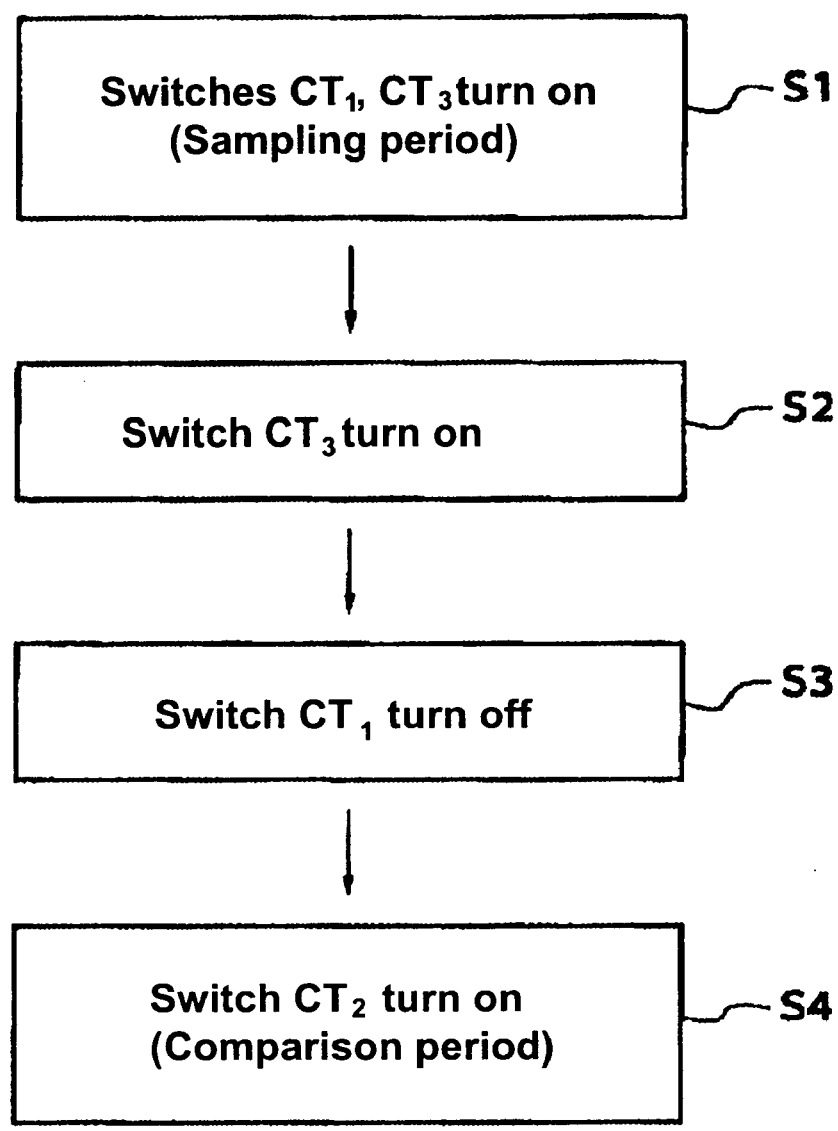
FIG. 3 shows a chart to describe a method for comparison and judgment by the chopper type comparator in accordance with the first embodiment of the present invention.

FIG. 3 shows a chart to describe a method for comparison and judgment by the chopper type comparator in accordance with the first embodiment of the present invention.

Referring to FIG. 3, first, the switches $CT_1$ and $CT_3$ are turned on (Step 1). Then, a voltage on an input side of the capacitor $C_1$ becomes an input voltage $V_{IN}$, and a voltage on an output side thereof becomes a voltage $V_B$, such that the capacitor $C_1$ is charged with their difference voltage ($V_{IN}-V_B$). Here, the voltage $V_B$ is a logical threshold voltage of the CMOS inverter 12, and its period is called a sampling period ($T_S$).

Next, the switch $CT_3$ is turned off (Step 2), and then the switch $CT_1$ is turned off (Step 3).

In this instance, the switch $CT_2$ is turned on (Step 4), and the input voltage $V_{IN}$ and the reference voltage $V_{RF}$ are compared, whose period is called a comparison period ($T_C$).

Figure 4:
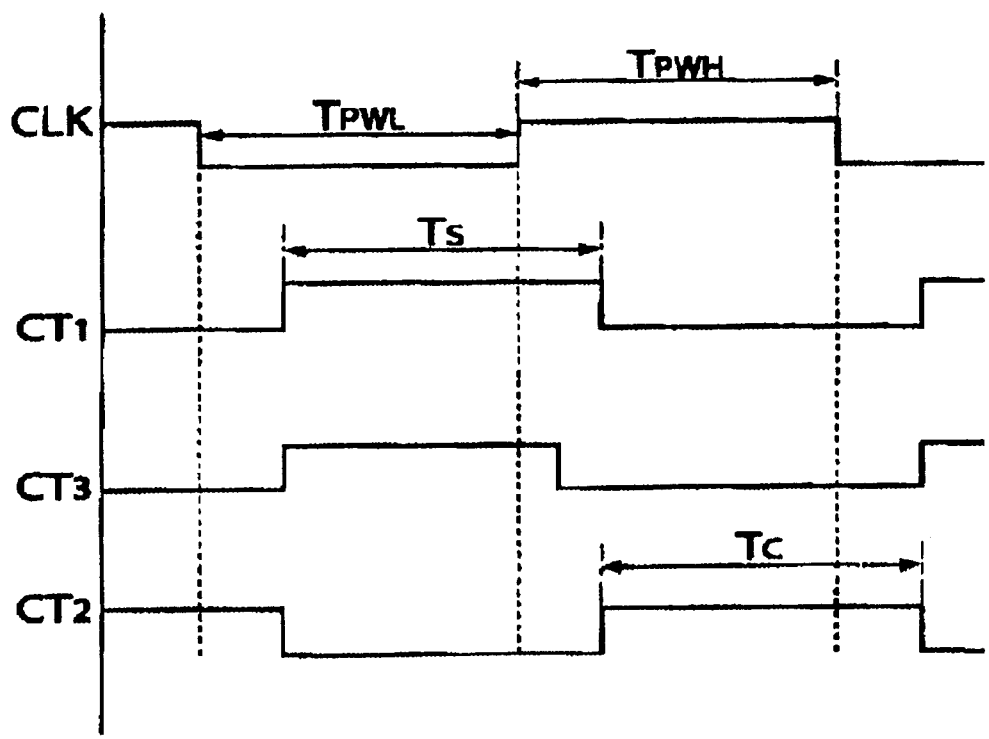
FIG. 4 shows a timing chart indicating the above described comparison and judgment.

FIG. 4 shows a timing chart indicating the above described comparison and judgment.

FIG. 4 shows a timing chart of a control signal CLK that controls the comparator shown in FIG. 1, and various control signals that are inputted in the respective switches $CT_1$, $CT_2$ and $CT_3$. Referring to FIG. 4, when the control signal CLK becomes LOW ($T_{PWL}$), and after a slight delay, the switch $CT_2$ is turned off, and the switches $CT_1$ and $CT_3$ are turned on, generally simultaneously. As the switch $CT_1$ is turned on, a sampling is conducted for a period $T_s$.

When the control signal CLK becomes HIGH ($T_{HIGH}$), and after a slight delay, the switch $CT_1$, is turned off and the switch $CT_2$ is turned on generally simultaneously, and a comparison is conducted for the period $T_C$.

With the chopper type comparator of the example described above, since the capacity of the capacitor $C_1$ does not need to be increased to suppress the voltage change $dV_1$ that may be caused by charge noises, a higher operation speed is attained, and the chip area can be small.

Also, the reference voltage VRF is not outputted, and a comparison can be reliably conducted in a comparison period.

Furthermore, the switches $CT_1$, and $CT_2$ can be generally simultaneously switched, the field through can be cancelled and the voltage change $dV_1$ itself can be reduced.

Next, a chopper type comparator in accordance with a second embodiment of the present invention will be described.

Figure 5:
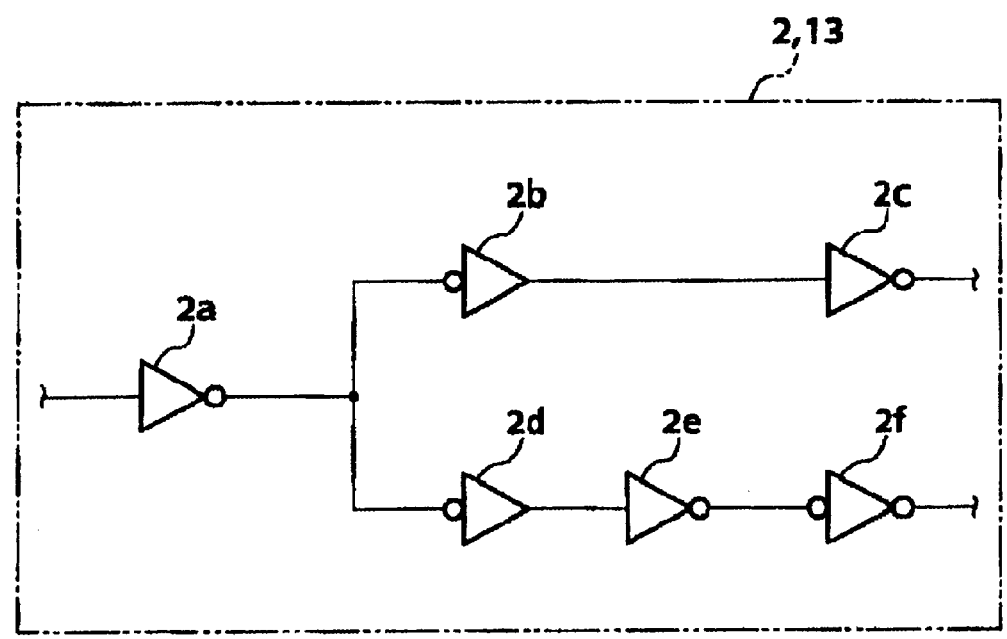
FIG. 5 shows a structure of a control driver circuit of the chopper type comparator in accordance with a second embodiment of the present invention.

FIG. 5 shows a structure of a control driver circuit of the chopper type comparator in accordance with the second embodiment of the present invention. In this example, a description is made as to the control driver circuit, and other parts can be structured in the same manner as that of the chopper type comparator shown in FIG. 1.

FIG. 5 shows a control driver circuit 2, 13 (see FIG. 1) of the chopper type comparator. An inverter 2a is disposed on a control signal input side of the control driver circuit 2, 13. An output side of the inverter 2a is bifurcated. On one side, inverters 2b and 2c are disposed. On the other side, inverters 2d, 2e and 2f are disposed. An output side of the inverter 2c connects to the gate terminals $P_1$ and $N_2$ (see FIG. 1), and outputs a control signal. An output side of the inverter 2f connects to the gate terminals $P_2$ and $N_1$ (see FIG. 1), and outputs a control signal.

Here, a drain-source current $I_{ds}$ of the inverter is given by $I_{ds} = \beta(V_{gs}-V_{th})^2/2$. When an L-size (transistor length) of transistors that compose the inverter is L, and a W value (effective channel width) of the transistors that composes the inverter is W, $\beta$ is given by $\beta=\mu_0 C_0$ (W/L). Also, $V_{gs}$ is a gate-source voltage, and $V_{th}$ is a threshold voltage of the switches $CT_1$, $CT_2$ and $CT_3$.

Further, the on-resistance of the switch is given by $R_{on}=V_{ds}/I_{ds}$. The L-size of the inverter 2b of this example is two times the L-size of the inverter 2d, 2e. In this instance, if the transistors that compose the inverters 2b, 2d and 2e use a W value (effective channel width) that makes the channel conductance $\beta_N$ and $\beta_P$ to be generally equal to one another, the value $R_{on}$ of the inverter 2b becomes twice as large as the value $R_{on}$ of the inverter 2d, 2e.

In other words, a delay for the single inverter 2b becomes generally equal to a sum of delays for the inverters 2d and 2e, such that switching from the gate terminals $P_1$ and $N_2$ to the gate terminals $P_2$ and $N_1$ can be conducted generally simultaneously without a delay. By this, the field through at the time of switching can be cancelled, and a voltage change due to charge noises can be controlled, such that a prolongation of the amplifier response can be suppressed.

Next, a chopper type comparator in accordance with a third embodiment of the present invention will be described.

Figure 6:
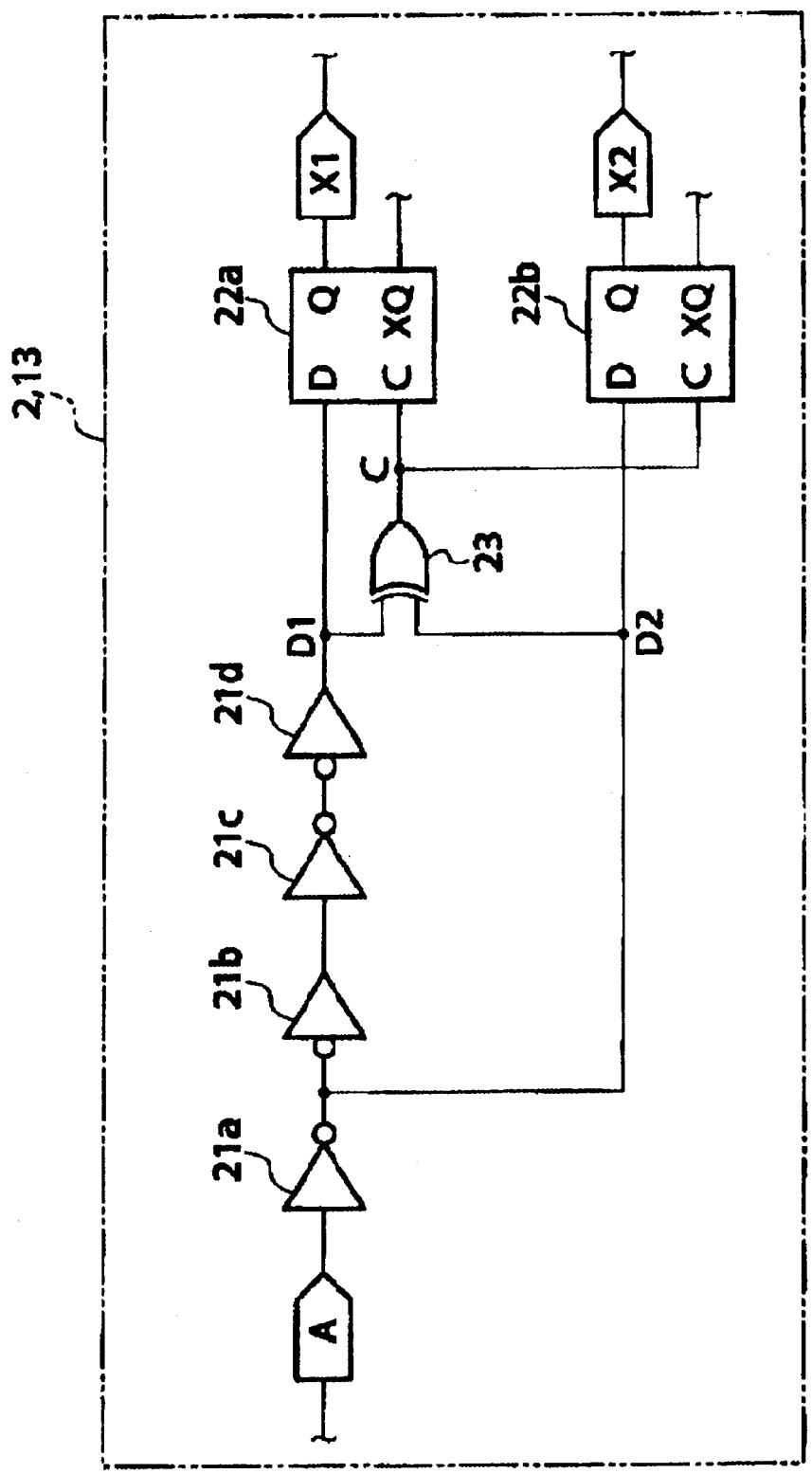
FIG. 6 shows a structure of a control driver circuit of the chopper type comparator in accordance with a third embodiment of the present invention.

FIG. 6 shows a structure of a control driver circuit of the chopper type comparator in accordance with the third embodiment of the present invention. In this example, a description is made as to the control driver circuit, and other parts can be structured in the same manner as that of the chopper type comparator shown in FIG. 1.

FIG. 6 shows a control driver circuit 2, 13 (see FIG. 1) of the chopper type comparator. A control signal A is inputted in the control driver circuits 2 and 13. An inverter 21a is disposed on an input side of the control driver circuit 2, 13. An output side of the inverter 21a is bifurcated. On one side, inverters 21b, 21c and 21d are disposed. On the other side, no inverter is disposed. The inverter 21d provides an output signal D1, and the inverter 21a provides an output signal D2. An output side of the inverter 21d is bifurcated into two outputs, wherein one of them is inputted in a D flip-flop 22a, and the other is inputted in an EXOR circuit 23. The output signal D2 of the inverter 21a is also bifurcated into two outputs, wherein one of them is inputted in the EXOR circuit 23, and the other is inputted in a D flip-flop 22b. An output signal C of the EXOR circuit 23 is bifurcated into two outputs, wherein one of them is inputted in the D flip-flop 22a, and the other is inputted in the D flip-flop 22b. Output signals X1 and X2 of the respective D flip-flops 22a and 22b are inputted in the gate terminals $P_1$ and $N_2$ (see FIG. 1) and the gate terminals $P_2$ and $N_1$ (see FIG. 1), respectively.

Figure 7:
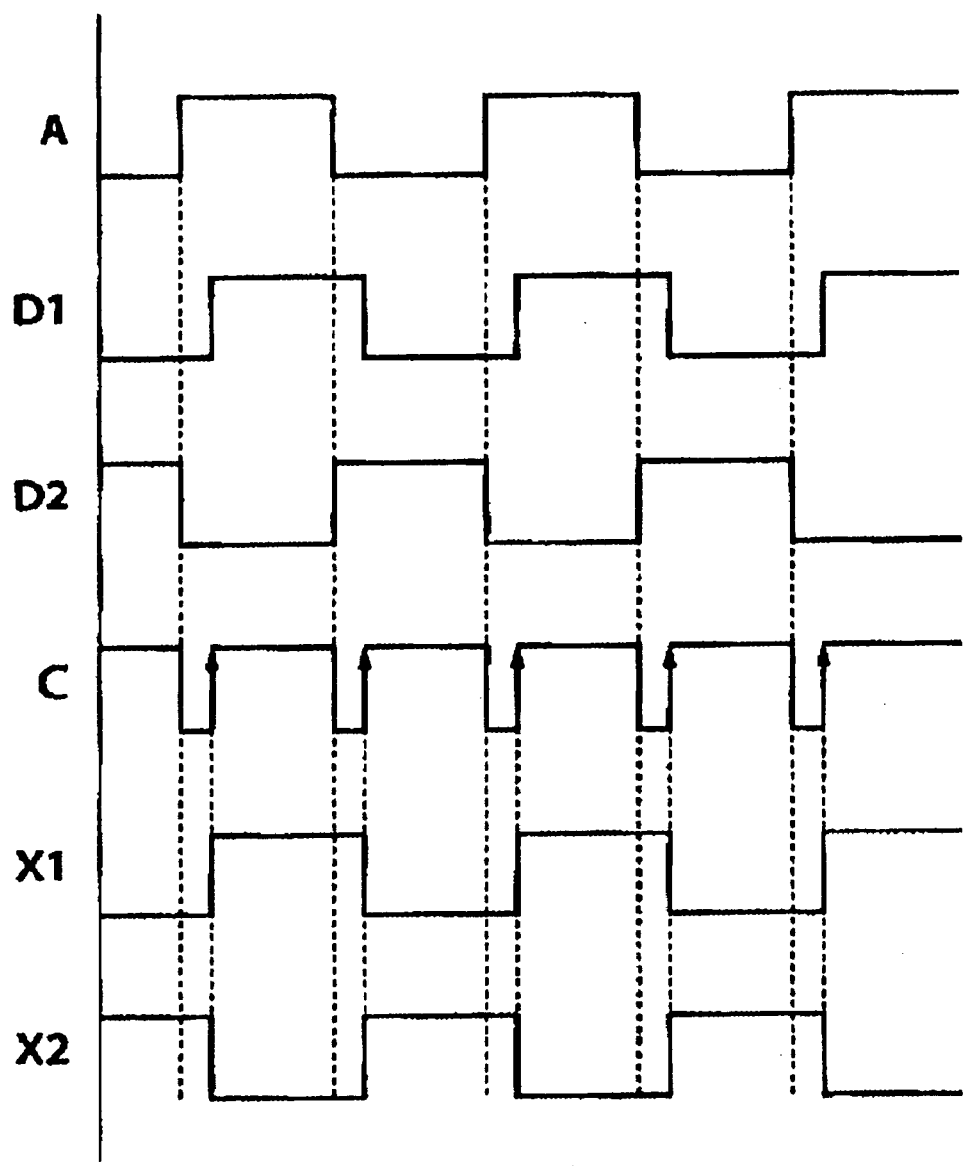
FIG. 7 shows a timing chart of control signals of the control driver circuit of the chopper type comparator in accordance with the third embodiment of the present invention.

FIG. 7 shows a timing chart of control signals of the control driver circuit of the chopper type comparator in accordance with the third embodiment of the present invention.

FIG. 7 shows a timing chart of the control signal A, the output signal D1 of the inverter 21d, the output signal D2 of the inverter 21a, the output signal C of the EXOR circuit 23, the output signal X1 of the D flip-flop 22a and the output signal X2 of the D flip-flop 22b of the control driver circuit shown in FIG. 6.

Referring to FIG. 7, when the control signal A of the control driver circuit becomes H (High) level, the output signal D1 of the inverter 21d at H level is outputted with being slightly delayed due to operations of the inverters 21a (with its output being at L level), 21b (with its output being at H level), 21c (with its output being at L level) and 21d (with its output being at H level). Also, when the control signal A of the control driver circuit becomes H (High) level, the output signal D2 of the inverter 21a at L level is outputted with being slightly delayed due to an operation of the inverter 21a (with its output being at L level).

As the output signal D1 of the inverter 21d and the output signal D2 of the inverter 21a are inputted in the EXOR circuit 23, the output signal C is outputted from the EXOR circuit 23. Here, when the output signal D1 and the output signal D2 are both at H level or L level, an output signal C at L level is outputted from the EXOR circuit 23. On the other hand, when the levels of the output signals D1 and D2 are different from each other, an output signal C at H level is outputted from the EXOR circuit 23.

When an output signal (clock pulse) of the EXOR circuit 23 is inputted in the D flip-flops 22a and 22b, their outputs in this instance are the same as the input signals. In other words, the D flip-flop 22a, which receives an input of the output signal D1 of the inverter 21d, outputs the output signal D1 as the output signal X1 at the moment when the clock pulse C is inputted. In the mean time, the D flip-flop 22b, which receives an input of the output signal D2 of the inverter 21a, outputs the output signal D2 as the output signal X2 at the moment when the clock pulse C is inputted. Here, since the clock pulse C is simultaneously inputted in the D flip-flops 22a and 22b, the control driver circuit outputs the control signals X1 and X2 at different levels in synchronism with each other.

By the control driver circuit described above, since the control signals X1 and X2 at different levels are outputted in synchronism with each other, switching from the gate terminals $P_1$ and $N_2$ to the gate terminals $P_2$ and $N_1$ can be conducted generally simultaneously without a delay. By this, the field through at the time of switching can be cancelled, and a voltage change due to charge noises can be controlled, such that an elongation of the amplifier response can be suppressed.

Next, a chopper type comparator in accordance with a fourth embodiment of the present invention will be described.

Figure 8:
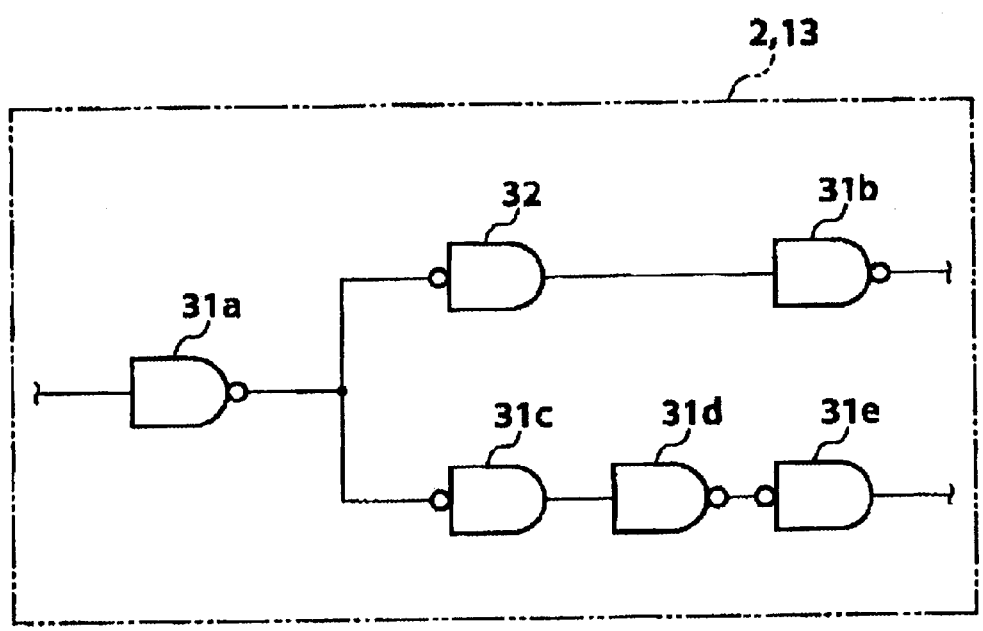
FIG. 8 shows a structure of a control driver circuit of the chopper type comparator in accordance with a fourth embodiment of the present invention.

FIG. 8 shows a structure of a control driver circuit of the chopper type comparator in accordance with the fourth embodiment of the present invention. In this example, a description is made as to the control driver circuit, and other parts can be structured in the same manner as that of the chopper type comparator shown in FIG. 1.

FIG. 8 shows a control driver circuit 2, 13 (see FIG. 1) of the chopper type comparator. An inverter 31a basically composed of NAND circuits is disposed on a control signal input side of the control driver circuit 2, 13. An output side of the inverter 31a is bifurcated into two outputs. On one side, inverters 32 and 31b are disposed. On the other side, inverters 31c, 31d and 31e are disposed. An output side of the inverter 31b connects to the gate terminals $P_1$ and $N_2$ (see FIG. 1), and outputs a control signal. An output side of the inverter 31e connects to the gate terminals $P_2$ and $N_1$ (see FIG. 1), and outputs a control signal.

Next, a structure of the inverter will be described in detail.

Figure 9:
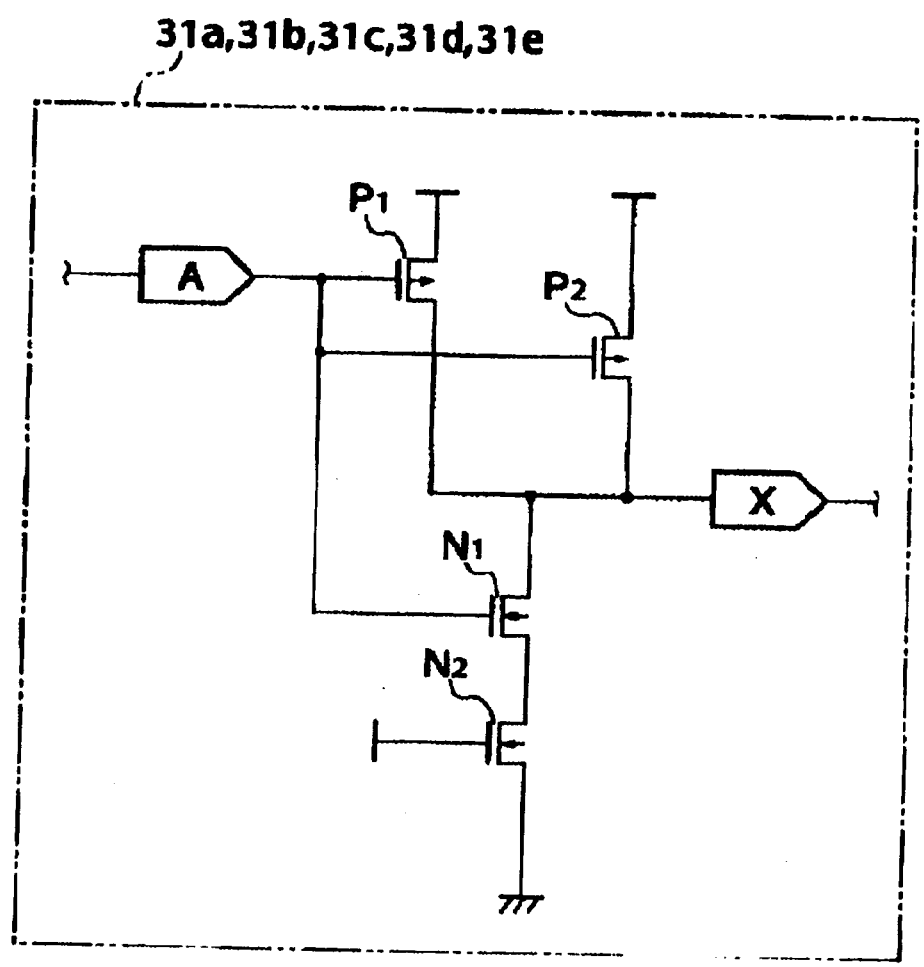
FIG. 9 shows a structure of each of the inverters 31a, 31b, 31c, 31d and 31e.

FIG. 9 shows a structure of each of the inverters 31a, 31b, 31c, 31d and 31e.

In each of the inverters 31a, 31b, 31c, 31d and 31e shown in FIG. 9, two P-channel transistors $P_1$ and $P_2$ disposed in parallel, and two N-channel transistors $N_1$ and $N_2$ disposed in series are disposed.

FIG. 10 shows a structure of the inverter 32.

In the inverter 32 shown in FIG. 10, four P-channel transistors $P_1$, $P_2$, $P_3$ and $P_4$ disposed in parallel and four N-channel transistors $N_1$, $N_2$, $N_3$ and $N_4$ disposed in series are disposed. The inverter 32 has a structure in which two of the inverters 31a, 31b, 31d and 31e shown in FIG. 9 are connected in series, and the L-size of the inverter 32 is substantially two times the L-size of the inverter 31a, 31b, 31d or 31e.

In the control driver circuit described above, since the N-channel transistors are disposed in series, and the P-channel transistors are disposed in parallel, a ratio between the value $\beta_N$ of the N-channel transistors and the value $\beta_P$ of the P-channel transistors becomes to be 1:1, such that the rising and falling sections become to be of equal through rate, as shown in FIG. 2.

Also, in the control driver circuit in this example, even when basic cells are used as the transistors, the values $\beta_N$ and $\beta_P$ can be made generally equal to each other, and a delay for the single inverter 32 and a sum of delays for the inverters 31c and 31d become generally equal to each other, such that switching from the gate terminals $P_1$ and $N_2$ to the gate terminals $P_2$ and $N_1$ can be conducted generally simultaneously without a delay. By this, the field through at the time of switching can be cancelled, and a voltage change due to charge noises can be controlled, such that an elongation of the amplifier response can be suppressed.

Next, a chopper type comparator in accordance with a fifth embodiment of the present invention will be described.

Figure 11:
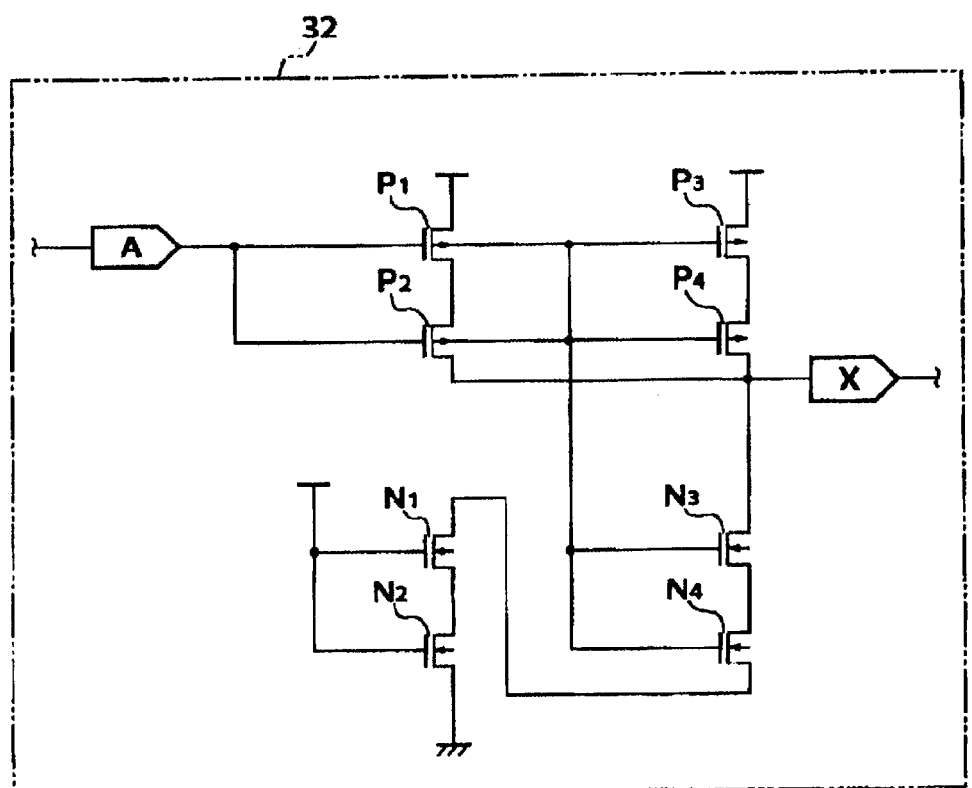
FIG. 11 shows a structure of a control driver circuit of the chopper type comparator in accordance with a fifth embodiment of the present invention.
Figure 12:
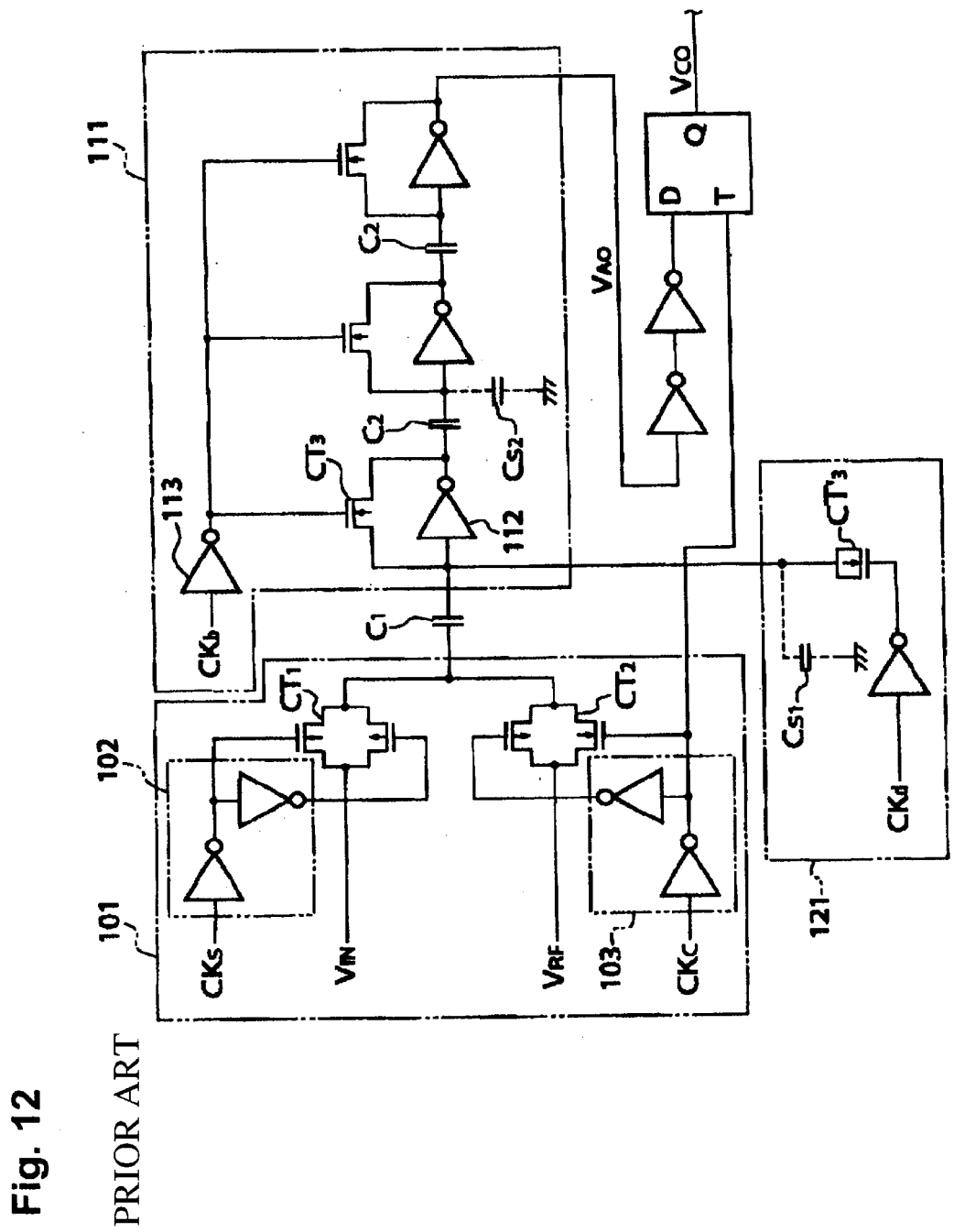
FIG. 12 shows one example of a chopper type comparator with CMOS structure.
Figure 13:
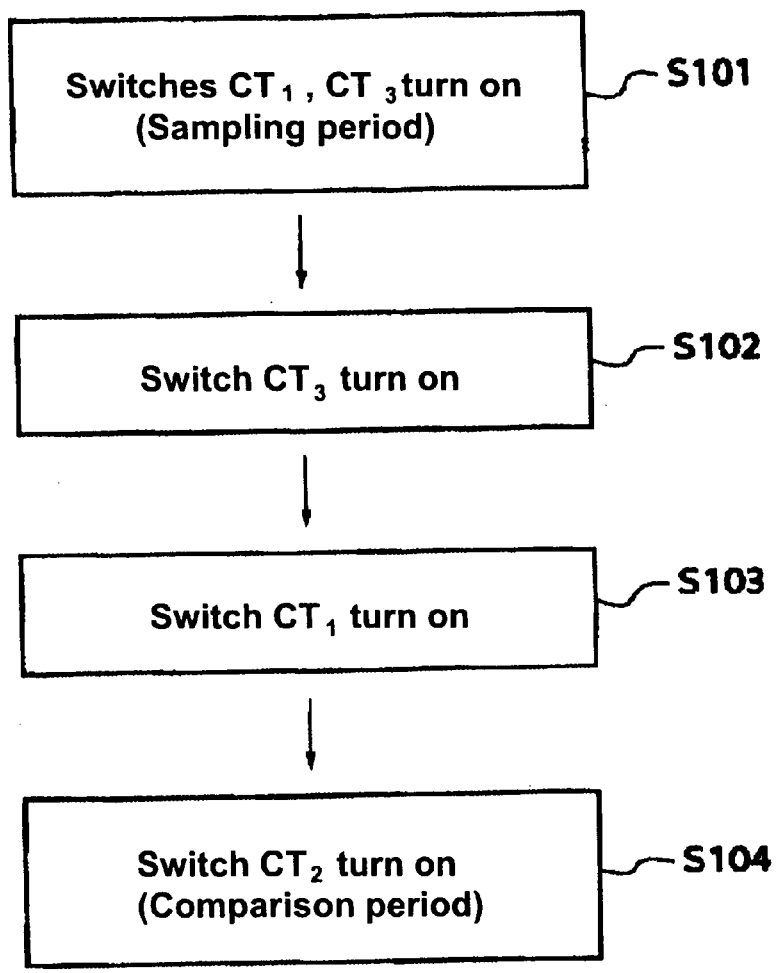
FIG. 13 shows a chart to describe a method for comparison and judgment by a chopper type comparator.
Figure 14:
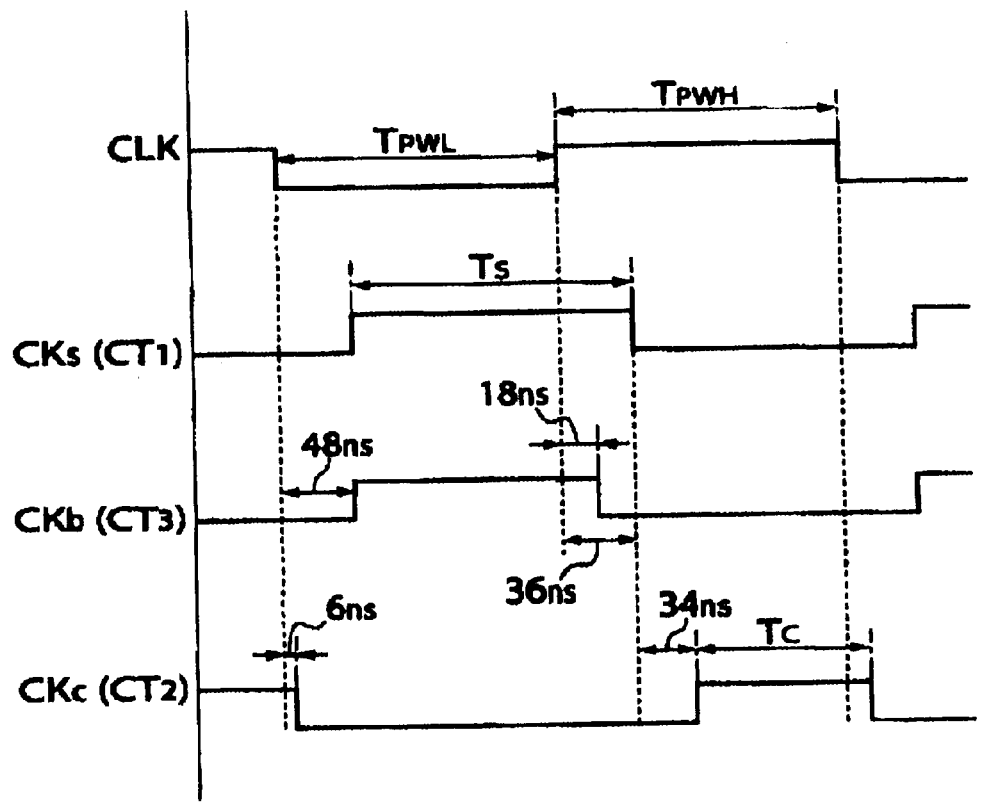
FIG. 14 shows a timing chart indicating the above described comparison and judgment.

FIG. 11 shows a structure of a control driver circuit of the chopper type comparator in accordance with the fifth embodiment of the present invention. In this example, a description is made as to an inverter that composes the control driver circuit, and other parts can be structured in the same manner as that of the control driver circuit shown in FIG. 8 or FIG. 9.

In the inverter 32 shown in FIG. 11, four P-channel transistors $P_1$, $P_2$, $P_3$ and $P_4$ disposed in series and four N-channel transistors $N_1$, $N_2$, $N_3$ and $N_4$ disposed in series are disposed.

In the control driver circuit described above also, a delay for the single inverter 32 and a sum of delays for the inverters 31c and 31d become generally equal to each other, such that switching from the gate terminals $P_1$ and $N_2$ to the gate terminals $P_2$ and $N_1$ can be conducted generally simultaneously without a delay. By this, the field through at the time of switching can be cancelled, and a voltage change due to charge noises can be controlled, such that an elongation of the amplifier response can be suppressed.

It is clear from the above description that the present invention can realize a chopper type comparator with an improved driver structure for controlling switches, which can reduce field through noise of analogue switches and is highly effective. The entire disclosure of Japanese Application No. 2001-206673 is incorporated by reference.

What is claimed is:

1. A chopper type comparator comprising:
   a first switch device including a PMOS transistor and an NMOS transistor for switching a voltage to be compared;
   a second switch device including a PMOS transistor and an NMOS transistor for switching a reference voltage;
   a capacitor connected to an output side of both the first and second switch devices for storing a charge according to the voltage;
   an amplification inverter connected to an output side of the capacitor and amplifying a capacitor output signal of the capacitor;
   a first control driver circuit outputting a clock signal for controlling both the first and second switch devices; and
   a second control driver circuit outputting a clock signal for controlling the amplification inverter,
   wherein the first control driver circuit is provided with two output devices,
   one output side of the first control driver circuit connects to a gate terminal of the PMOS transistor of the first switch device and a gate terminal of the NMOS transistor of the second switch device, or to a gate terminal of the NMOS transistor of the first switch device and a gate terminal of the PMOS transistor of the second switch device, and
   another output side of the first control driver circuit connects to a gate terminal of the NMOS transistor of the first switch device and a gate terminal of the PMOS transistor of the second switch device, or to a gate terminal of the PMOS transistor of the first switch device and a gate terminal of the NMOS transistor of the second switch device,
   wherein an intersection of a rising part and a falling part of drive output control signals of at least one of the first control driver circuit and the second control driver circuit defines a center of an amplitude of a drive signal;

wherein, in at least one of the first control driver circuit and the second control driver circuit, a drive input control signal that is inputted in the driver circuits is branched to two output circuits, wherein one of the two output circuits is provided with a plurality of first control inverters, and another of the two output circuits is provided with a plurality of second control inverters, the number of second control inverters being less than the number of first control inverters, wherein an L-size (transistor length) of transistors that form the second control inverters is two times an L-size of transistors that form the first control inverters.

2. A chopper type comparator comprising:

a first switch device including a PMOS transistor and an NMOS transistor for switching a voltage to be compared;

a second switch device including a PMOS transistor and an NMOS transistor for switching a reference voltage;

a capacitor connected to an output side of both the first and second switch devices for storing a charge according to the voltage;

an amplification inverter connected to an output side of the capacitor and amplifying a capacitor output signal of the capacitor;

a first control driver circuit outputting a clock signal for controlling both the first and second switch devices; and a second control driver circuit outputting a clock signal for controlling the amplification inverter, wherein the first control driver circuit is provided with two output devices, one output side of the first control driver circuit connects to a gate terminal of the PMOS transistor of the first switch device and a gate terminal of the NMOS transistor of the second switch device, or to a gate terminal of the NMOS transistor of the first switch device and a gate terminal of the PMOS transistor of the second switch device, and another output side of the first control driver circuit connects to a gate terminal of the NMOS transistor of the first switch device and a pate terminal of the PMOS transistor of the second switch device, or to a gate terminal of the PMOS transistor of the first switch device and a gate terminal of the NMOS transistor of the second switch device, wherein an intersection of a rising part and a falling part of drive output control signals of at least one of the first control driver circuit and the second control driver circuit defines a center of an amplitude of a drive signal;

wherein, in at least one of the first control driver circuit and the second control driver circuit, a drive input control signal that is inputted in the driver circuits is branched to two output circuits, wherein one of the two output circuits connects to a first D flip-flop and an EXOR circuit through a plurality of control inverters, and another of the two output circuits connects to a second D flip-flop and the EXOR circuit, wherein output sides of the EXOR circuits connect to both of the flip-flops, and both of the flip-flops output signals to be inputted to the flip-flops upon receiving control signals from the EXOR circuits.

3. A chopper type comparator comprising:

a first switch device including a PMOS transistor and an NMOS transistor for switching a voltage to be compared;

a second switch device including a PMOS transistor and an NMOS transistor for switching a reference voltage;

a capacitor connected to an output side of both the first and second switch devices for storing a charge according to the voltage;

an amplification inverter connected to an output side of the capacitor and amplifying a capacitor output signal of the capacitor;

a first control driver circuit outputting a clock signal for controlling both the first and second switch devices; and a second control driver circuit outputting a clock signal for controlling the amplification inverter, wherein the first control driver circuit is provided with two output devices, one output side of the first control driver circuit connects to a gate terminal of the PMOS transistor of the first switch device and a gate terminal of the NMOS transistor of the second switch device, or to a gate terminal of the NMOS transistor of the first switch device and a gate terminal of the PMOS transistor of the second switch device, and another output side of the first control driver circuit connects to a gate terminal of the NMOS transistor of the first switch device and a gate terminal of the PMOS transistor of the second switch device, or to a gate terminal of the PMOS transistor of the first switch device and a gate terminal of the NMOS transistor of the second switch device, wherein an intersection of a rising part and a falling part of drive output control signals of at least one of the first control driver circuit and the second control driver circuit defines a center of an amplitude of a drive signal;

wherein, in at least one of the first control driver circuit and the second control driver circuit, a drive input control signal that is inputted in the driver circuits is branched to two output circuits, wherein one of the two output circuits is provided with a first control inverter including a plurality of NAND circuits, and another of the two output circuits is provided with a second control inverter including NAND circuits, the number of NAND circuits of the second control inverter being less than the number of NAND circuits of the first control inverter, wherein a substantial L-size (transistor length) of the second control inverter is two times an L-size of the first control inverter.

4. A chopper type comparator according to claim 3, wherein two P-channel transistors disposed in parallel and two N-channel transistors disposed in series are disposed in the first control inverter, and four P-channel transistors disposed in parallel, and four N-channel transistors disposed in series are disposed in the second control inverter.

5. A chopper type comparator according to claim 3, wherein two P-channel transistors disposed in parallel and two N-channel transistors disposed in series are disposed in the first control inverter, and four P-channel transistors disposed in series, and four N-channel transistors disposed in series are disposed in the second control inverter.

* * * * *